Nov. 3, 1959 A. S. M. BACH 2,911,565
CURRENT FEEDBACK CIRCUIT FOR BALANCED AMPLIFIERS
Filed April 9, 1956
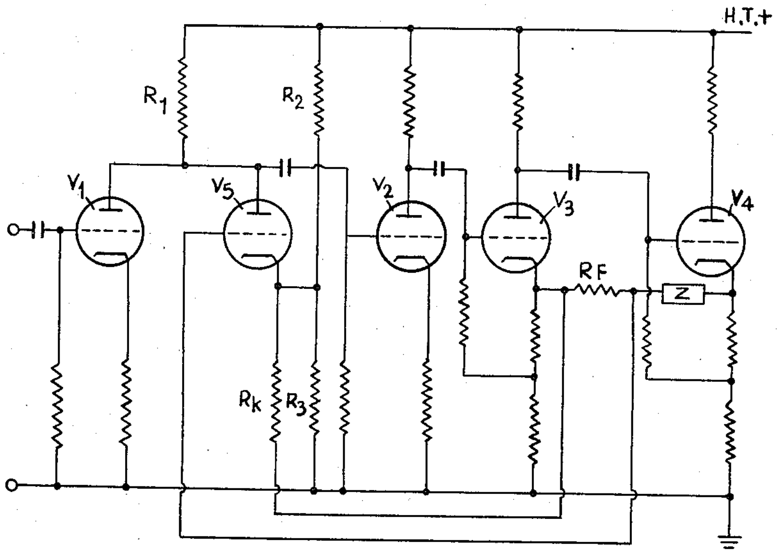
Inventor
Sammy M. A. Bach
By Holcomb, Wetherill & Brisebois
Attorney 2,911,565

CURRENT FEEDBACK CIRCUIT FOR BALANCED AMPLIFIERS

Ashley S. M. Bach, Cambridge, England, assignor to Pye Limited, Cambridge, England, a British company Application April 9, 1956, Serial No. 577,134
Claims priority, application Great Britain April 21, 1955
13 Claims. (Cl. 315—27)

It has previously been proposed to employ a feedback connection from the output stage of a current amplifier to a point in one of the preceding stages of the amplifier. For example such feedback is sometimes employed in a vertical magnetic deflection amplifier in a television camera or monitor equipment.

The present invention relates to a feedback arrangement, particularly for a direct coupled balanced amplifier stage in which the current waveform through the load rather than the voltage waveform across the load is of particular importance.

In symmetrical circuits, such as balanced circuits which are balanced about earth to alternating waveform components, it is normally necessary to divide the output load and insert the feedback load, for example a resistor, in the centre of the output load in order to eliminate undesirable voltage feedback via the feedback circuit.

The present invention provides an arrangement which avoids the necessity of dividing the output load from the balanced amplifier and enables a feedback load to be inserted in series with the output load whilst substantially avoiding undesirable voltage feedback.

According to the present invention, a feedback load is connected in series with the output load of a balanced amplifier and a current feedback connection is made from said feedback load through a feedback amplifying stage to a preceding stage of said amplifier, and a further connection is also provided between the feedback load and said feedback amplifying stage in order to produce, in the output of the feedback amplifying stage, a voltage in anti-phase to the undesired voltage component in the output of said feedback amplifying stage whereby undesired voltage feedback is substantially reduced or eliminated.

The feedback load is preferably a resistor, and the voltage produced across the resistor which is proportional to the desired current feedback may be fed to the grid of a valve forming the feedback amplifying stage. The cathode of this valve is connected to the other end of the feedback resistor so that a voltage is produced at the cathode of a phase relative to the undesired voltage feedback component on the grid such that the voltages are in anti-phase at the anode of the feedback amplifying valve, whereby the undesired voltage feedback component is thereby substantially eliminated.

In order that the invention may be more fully understood, reference will now be made to the accompanying drawing, which shows the basic circuit diagram of a direct-coupled balanced vertical magnetic deflection amplifier for television use, employing a current feedback circuit according to the invention.

Referring to the drawing, valve V1 constitutes the output stage of a deflecting voltage waveform generator, the complete waveform generator circuit not being shown. The output of the generator is applied through a voltage amplifier stage V2 to the balanced output stage comprising valves V3 and V4. The output load circuit which comprises one or more deflector coils Z and a feedback resistance $R_f$ in series is directly connected between the cathodes of valves V3 and V4.

According to the present invention, in order to provide the desired current feedback, the feedback resistor $R_f$ is connected in series with the load Z and a voltage is produced across this resistor proportional to the current flowing through it. The feedback voltage derived from the junction of resistor $R_f$ and the load Z is applied to the grid of a feedback amplifier valve V5 having a common load resistor R1 with the voltage waveform generator output valve V1. Since the feedback resistor $R_f$ is unbalanced with respect to the load Z an undesirable voltage feedback component is also developed across this resistor and applied to the grid of valve V5, so that the voltage at the grid of valve V5 consists of both a wanted voltage feedback and an undesirable voltage feedback. In order to eliminate this undesired voltage feedback component, the cathode of valve V5 is connected through a cathode load resistor $R_k$ to the other end of the feedback resistor, and the cathode of V5 is also connected to the junction of two resistors R2 and R3 connected across the high tension supply. With this arrangement, a portion of the voltage existing between the feedback resistor $R_f$ and earth will appear across the cathode resistor $R_k$ of the feedback amplifier valve and hence between grid and cathode of this valve. The phase of this voltage relative to the phase of the undesired voltage feedback components on the grid of valve V5 will be such that these voltages are in anti-phase at the anode of valve V5. Thus, by suitably proportioning resistors R2, R3 and $R_k$, the undesired voltage feedback component at the anode of valve V5 may be substantially eliminated and only the desired current feedback is effective.

Whilst a particular embodiment has been described, it will be understood that various modifications may be made without departing from the scope of this invention. For example, although the invention has been described as applied to a vertical magnetic deflection amplifier for television use, it may be applied to any other type of balanced amplifier. Furthermore, although in the circuit diagram the valves are shown as triodes, it will be understood that tetrodes, pentodes or other multi-grid valves may be employed.

I claim:

1. A balanced current amplifier comprising a first amplifying stage and a balanced output stage fed from said first amplifying stage, an output load connected to said balanced output stage, a feedback load connected in series with said output load, a feedback amplifying stage, a current feedback connection from said feedback load through said feedback amplifying stage to said first amplifying stage and a further feedback connection between said feedback load and said feedback amplifying stage producing a voltage in the output of said feedback amplifying stage which is in anti-phase to the undesired voltage component in the current feedback connection.

2. An amplifier as claimed in claim 1, in which the feedback load comprises a resistor.

3. A balanced current amplifier comprising a first amplifying stage and a balanced output stage fed from said first amplifying stage, an output load connected to said balanced output stage, a feedback load connected in series with said output load, a feedback amplifying stage comprising a valve having a first input electrode, a second input electrode and an output electrode, a current feedback connection from said feedback load to the first input electrode of said valve, a further feedback connection between said feedback load and the second input electrode of said valve producing a voltage at the output electrode of said feedback amplifying valve which is in anti-phase to the undesired voltage component in the current feedback at the output electrode of said feedback amplifying valve, and a connection between the output electrode of said valve and said first amplifying stage.

4. An amplifier as claimed in claim 3, in which the current feedback connection is joined at the junction between said feedback load and said output load.

5. An amplifier as claimed in claim 4, in which the further feedback connection is joined to that end of said feedback load which is not connected to said output load.

6. A balanced current amplifier, comprising a first amplifier stage, a balanced output stage fed from said first amplifier stage, and consisting of a first amplifying valve having a signal input electrode and an output electrode, and a second amplifying valve having a signal input electrode and an output electrode, an output load connected between the output electrode of said first valve and the output electrode of said second valve, a feedback load connected in series with said output load between said output electrodes, a feedback current amplifier valve having a first input electrode, a second input electrode and an output electrode, a current feedback connection from the junction of said output load and said feedback load to said first input electrode, a resistor forming a second feedback path connected between the second input electrode and the junction between the output electrode of said first balanced amplifier valve and said feedback load, a high tension supply, a resistor network connected across said high tension supply and a connection between the second input electrode of said current feedback amplifier and an intermediate point on said resistor network, and a connection between the output electrode of said current feedback amplifier and said first amplifying stage.

7. An amplifier as claimed in claim 6, in which the output load and feedback load are connected in series between the cathodes of said push-pull output valves.

8. A balanced current amplifier for amplifying deflection currents to be fed to a deflector coil arrangement, comprising a first amplifier stage, a balanced output stage fed from said first amplifier stage, and consisting of a first valve having an anode, a signal input grid and an output cathode, and a second valve having an anode, a signal input grid and an output cathode, at least one deflector coil connected between the cathode said first valve and the cathode of said second valve, a feedback resistor connected in series with said at least one deflector coil between said cathodes, means connecting the anode of said first valve to the grid of said second valve, a feedback current amplifier valve having a grid, a cathode and an anode, a current feedback connection from the junction of said at least one deflector coil and said feedback resistor to said grid a resistor forming a second feedback path connected between the cathode of said current feedback amplifier and the junction between the output electrode of said first balanced amplifier valve and said feedback resistor, a high tension supply, a resistor network connected across said high tension supply and a connection between the cathode of said current feedback amplifier and an intermediate point on said resistor network, and a connection between the anode of said current feedback amplifier and said first amplifying stage.

9. A balanced current amplifier comprising a first amplifier stage, a balanced output stage fed from said first amplifier stage, and consisting of a first valve having an anode, an input grid and an output cathode and a second valve having an anode, an input grid and an output cathode, an output load connected between the cathode of said first valve and the cathode of said second valve, a feedback load connected in series with said output load between said cathodes, means connecting the anode of said first valve to the grid of said second valve, a feedback current amplifier valve having an anode, a cathode and an input grid electrode, a current feedback connection from the junction of said output load and said feedback load to said input grid of said current feedback amplifier valve, a resistor forming a second feedback path connected between the cathode of said current feedback amplifier and the junction between the cathode of said first balanced amplifier valve and said feedback load, a high tension supply, a resistor network connected across said high tension supply, and a connection between the cathode of said current feedback amplifier and an intermediate point on said resistor network, the proportion between said resistor connected in the cathode of said current feedback amplifier and the tapping point on said resistor network being such that the undesired voltage feedback component at the anode of the current feedback amplifier is substantially eliminated, and a connection between the anode of said current feedback amplifier and said first amplifying stage.

10 A balanced current amplifier for amplifying deflection currents to be fed to a deflector coil arrangement, comprising a first amplifier stage, a balanced output stage fed from said first amplifier stage and consisting of a first valve having an anode, an input grid and an output cathode, and a second valve having an anode, an input grid and an output cathode, at least one deflector coil connected between the output cathode of said first valve and the output cathode of said second valve, a feedback load resistor connected in series with said at least one deflector coil between said cathodes, means connecting the anode of said first valve to the grid of said second valve, a feedback current amplifier valve having an anode, a cathode and an input grid electrode, a current feedback connection from the junction of said at least one deflector coil and said feedback load to said input grid of said current feedback amplifier valve, a resistor forming a second feedback path connected between the cathode of said current feedback amplifier and the junction between the cathode of said first balanced amplifier valve and said feedback load, a high tension supply, a resistor network connected across said high tension supply and a connection between the cathode of said current feedback amplifier and an intermediate point on said resistor network, the proportions between said resistor connected in the cathode of said current feedback amplifier and the tapping point on said resistor network being such that the undesired voltage feedback component at the anode of the current feedback amplifier is substantially eliminated, and a connection between the anode of said current feedback amplifier and said first amplifying stage.

11. In a current amplifier having a balanced output stage, an output load connected to said balanced output stage, a feedback amplifier, means for deriving a first feedback voltage proportional to the current through said output load and for feeding said first feedback voltage to said feedback amplifier, means for feeding the output of said feedback amplifier stage to the input of said balanced output stage, means for deriving a further feedback voltage proportional to undesired voltage fluctuations in said first feedback voltage, and means for applying said further feedback voltage to said feedback amplifier stage in a phase to compensate for said undesired voltage fluctuations in said first feedback voltage.

12. In a current amplifier having a balanced output stage and at least one preceding stage, an output load connected to said balanced output stage, a feedback amplifier, means for deriving a first feedback voltage proportional to the current through said output load and for feeding said first feedback voltage to said feedback amplifier, means for feeding the output of said feedback amplifier stage to a stage of said amplifier preceding said balanced output stage, means for deriving a further feedback voltage proportional to undesired voltage fluctuations in said first feedback voltage, and means for applying said further feedback voltage to said feedback amplifying stage in a phase to compensate for said undesired voltage fluctuations in said first feedback voltage.

13. In a current amplifier having a balanced output stage and at least one preceding stage, an output load connected to said balanced output stage, a feedback load connected in series with said output load, a feedback amplifier, means for deriving a first feedback voltage from across said feedback load proportional to the current through said output load and for feeding said first feedback voltage to said feedback amplifier, means for feeding the output of said feedback amplifier stage to a stage of said amplifier preceding said balanced output stage, means for deriving a further feedback voltage proportional to undesired voltage fluctuations in said first feedback voltage, and means for applying said further feedback voltage to said feedback amplifying stage in a phase to compensate for said undesired voltage fluctuations in said first feedback voltage.

References Cited in the file of this patent

UNITED STATES PATENTS

| | | |
|---|---|---|
| 2,538,488 | Volkers | Jan. 16, 1951 |
| 2,550,990 | Gilbert | May 1, 1951 |
| 2,581,456 | Swift | Jan. 8, 1952 |
| 2,598,326 | White et al. | May 27, 1952 |
| 2,714,137 | Dzwons | July 26, 1955 |
| 2,728,876 | Varela | Dec. 27, 1955 |
| 2,741,723 | Pacini | Apr. 10, 1956 |
| 2,771,517 | Harrison et al. | Nov. 20, 1956 |